United States Patent
Morita et al.

(10) Patent No.: US 6,443,168 B1
(45) Date of Patent: Sep. 3, 2002

(54) PLATE-LIKE SPECIMEN FLUID-TREATING APPARATUS AND PLATE-LIKE SPECIMEN FLUID-TREATING METHOD

(75) Inventors: Fumio Morita; Masataka Fujiki; Hitoshi Oka, all of Tokyo; Noriyuki Oroku; Yuichirou Tanaka, both of Kanagawa-ken, all of (JP)

(73) Assignees: Hitachi Kokusai Electric Inc., Tokyo (JP); Hitachi, Ltd., Tokyo (JP)

( * ) Notice: Subject to any disclaimer, the term of this patent is extended or adjusted under 35 U.S.C. 154(b) by 227 days.

(21) Appl. No.: 09/579,142

(22) Filed: May 30, 2000

(30) Foreign Application Priority Data

May 31, 1999 (JP) .......................................... 11-152334

(51) Int. Cl.[7] ................................................ B08B 3/02
(52) U.S. Cl. ........................ 134/105; 134/153; 134/902
(58) Field of Search ................................ 134/105, 153, 134/902

(56) References Cited

U.S. PATENT DOCUMENTS 5,513,668 A * 5/1996 Sumnitsch .............. 134/153 X
5,518,542 A * 5/1996 Matsukawa et al. ..... 134/902 X
5,979,475 A * 11/1999 Satoh et al. ............. 134/153 X
6,197,150 B1 * 3/2001 Kwag et al. ............. 134/153 X
6,318,385 B1 * 11/2001 Curtis et al. ............ 134/902 X

FOREIGN PATENT DOCUMENTS

JP 9-17761 1/1997

* cited by examiner

Primary Examiner—Philip Coe
(74) Attorney, Agent, or Firm—McGinn & Gibb, PLLC

(57) ABSTRACT

The fluid treatment apparatus, as disclosed, comprises upper and lower Bernoulli-plates 12 and 14, each of which includes a metal plate 25 provided on overall outer surface thereof. On each of the metal plates 25, there is arranged a spiral-shaped circulating pipe 24 through which a heating medium or a cooling medium are circulated so as to rapidly heat or cool the upper and lower Bernoulli-plates. During the treatment of a wafer 16 by the apparatus, the upper and lower Bernoulli-plates are disposed in parallel with each other to define a narrow gap therebetween while a clearance between the wafer 16 and the upper Bernoulli-plate and a clearance between the wafer 16 and the lower Bernoulli-plate are kept to be equal to each other. Thus, the present invention can achieve various purpose such as a time saving for the cleaning, reduction of consumption of the cleaning liquid and inhibition of cleaning irregularity.

9 Claims, 4 Drawing Sheets

PLATE-LIKE SPECIMEN FLUID-TREATING APPARATUS AND PLATE-LIKE SPECIMEN FLUID-TREATING METHOD

BACKGROUND OF THE INVENTION

1. Field of the Invention

The present invention relates to a plate-like specimen fluid-treating apparatus and a plate-like specimen fluid-treating method. More particularly, the invention relates to a plate-like specimen fluid-treating apparatus and a method therefore, wherein a plate-like specimen (e.g., a wafer such as a semiconductor wafer) is arranged between parallel upper and lower Bernoulli-plates and disposed in a parallel confronting relation to inner surfaces of the upper and lower Bernoulli-plates, the plate-like specimen being subjected to a fluid treatment (e.g., cleaning) by ejection of a treatment liquid (e.g., a cleaning liquid) onto opposite surfaces of the plate-like specimen which is driven to rotate.

2. Description of the Related Art

A conventional sheet cleaning apparatus, known as a fluid treatment apparatus adapted for a plate-like specimen, is designed as shown in FIG. 5, wherein a cleaning liquid is ejected to a wafer 100 from a plurality of jet nozzles 104 under an atmosphere while the wafer 100 is being chucked with a chuck pin 102, thereby cleaning the wafer. In this structure, the cleaning liquid is ejected in a neighborhood of a central portion of the wafer which is driven to rotate, thus causing the cleaning liquid on the wafer to be blown to an outer periphery of the wafer by mean of centrifugal force for cleaning thereof. The cleaning liquid is used at a chemicals temperature of about 80° C. in dependence of cleaning purposes.

However, since the wafer 100 onto which the cleaning liquid is ejected is normally at room temperature, it is needed to take into consideration a time for rising in temperature of the wafer. On the other hand, since the wafer will emit heat from a rear surface thereof while the wafer is being heated by the cleaning liquid, it requires a large amount of heat capacity, i.e., a great amount of the cleaning liquid, for rising in temperature of the wafer to about 80° C. Furthermore, the temperature of the cleaning liquid as ejected above will be remarkably lowered as the cleaning liquid goes to the periphery of the wafer 100 farther from a location at which the cleaning liquid is put down on the surface of the wafer 100, thereby causing its temperature distribution on the wafer to be locally largely varied in temperature difference. As a result, the wafer 100 may be irregularly cleaned so that it will be difficult to shorten a cleaning time without an extra consumption of the cleaning liquid.

To meet such problems, there is proposed a cleaning treatment apparatus in Japanese laid-open patent publication No. 09-17761. In this prior art apparatus, a heating-medium circulating passage arrangement is disposed under a holding surface mounted on a spin chuck body and adapted for rotatably holding a wafer thereon. Above the spin chuck, there is provided a heat-insulation body having a cleaning-liquid supply nozzle and adapted to be movable upwardly and downwardly with respect to the spin chuck. The cleaning-liquid supply nozzle is capable of supplying a cleaning liquid to the wafer held on the holding surface of the spin chuck. The heat-insulation body defines in cooperation with the spin chuck a heat insulation space for the wafer and the cleaning liquid. The heating-medium circulating passage arrangement is configured to keep the wafer held on the holding surface and the cleaning liquid at predetermined temperatures by means of circulation of the heating medium for temperature adjustment. Thus, it has been realized to reduce variations of a supply amount of the cleaning liquid and the time for cleaning treatment, thereby improving a throughput.

Disadvantageously, this prior art apparatus will inevitably interpose a large spacing or gap between the wafer and the heat insulation body, as a result of which it will be necessary to supply a great amount of the cleaning liquid for heating the wafer. Also, the wafer is directly placed on the holding surface of the spin chuck in this apparatus. Therefore, if the wafer has already been warped as a result of its thermal insulation previously continued or by the other treatments, there will be occurred temperature differences between uncontacted locations of the wafer due to its warp and contacted locations of the wafer with the holding surface of the chuck. This may disadvantageously lead to a cleaning irregularity of the wafer.

SUMMARY OF THE INVENTION

In view of the above, an object of the present invention is to provide a plate-like specimen fluid-treating apparatus and a method therefor by which it is enabled to uniform the temperature distribution of wafer along with shortening or saving of time for a treatment (cleaning) task, reduction of a treatment (cleaning) liquid, and prevention of occurrence of treatment (cleaning) irregularity. Consequently, it is possible to improve a yielding, a throughput and a cost reduction.

To this end, the present invention has a plate-like specimen fluid-treating apparatus including upper and lower Bernoulli-plates disposed in parallel with each other, wherein a plate-like specimen is disposed between the upper and lower Bernoulli-plates in a parallel confronting relation to inner surfaces of the upper and lower Bernoulli-plates such that a narrow gap of about 0.2 to 2 mm is created between the plate-like specimen and at least the upper Bernoulli-plate, and wherein at least the upper Bernoulli-plate and the plate-like specimen are relatively rotated while a treatment liquid is ejected to at least an upper surface of the plate-like specimen to treat the plate-like specimen, and a passage provided on the upper and lower Bernoulli-plates and adapted for supplying the upper and lower Bernoulli-plates with a heating medium or a cooling medium to heat or cool the upper and lower Bernoulli-plates.

Since at least the upper Bernoulli-plate and the plate-like specimen are spaced from each other to define the narrow gap therebetwen, it is possible to interpose only a cleaning liquid between the plate-like specimen and the upper Bernoulli-plate. Then, upon cleaning the rotating wafer, this clearance between the plate-like specimen and the upper Bernoulli-plate are allowed to be in a vacuum state. Therefore, it is possible to accurately and rapidly elevate the temperature of the plate-like specimen by a small amount of the cleaning liquid .

Also, in the present invention, the plate-like specimen preferably is disposed between the upper and lower Bernoulli-plates in such a manner that one surface of the plate-like specimen is spaced with a narrow gap from the upper Bernoulli-plate and that the other surface of the plate-like specimen is spaced with a narrow gap from the lower Bernoulli-plate.

Thus, since the plate-like specimen is heated in non-contact with the upper and lower Bernoulli-plates according to the present invention, any temperature differences cannot be occurred partially over the plate-like specimen, thereby heating the overall plate-like specimen uniformly.

Further, in the present invention, the plate-like specimen preferably is disposed between the upper and lower Bernoulli-plates in such a manner that one surface of the plate-like specimen is spaced from the upper Bernoulli-plate by a gap by which the other surface of the plate-like specimen is equivalently spaced from the lower Bernoulli-plate.

Thus, since the gap or clearance formed between the plate-like specimen and the upper Bernoulli-plate can be equal to that formed between the plate-like specimen and the lower Bernoulli-plate, it is easily possible to equally and uniformly elevate both temperatures of the cleaning liquid supplied to an upper side of the plate-like specimen and of the cleaning liquid supplied to a lower surface of the plate-like specimen.

According to another aspect of the present invention, a plate-like specimen fluid-treating method includes disposing upper and lower Bernoulli-plates in parallel with each other to define a narrow gap therebetween, disposing a plate-like specimen between the upper and lower Bernoulli-plates in a parallel confronting relation to inner surfaces of the upper and lower Bernoulli-plates such that the plate-like specimen is spaced with a narrow gap of about 0.2 to 2 mm from at least the upper Bernoulli-plate, and wherein at least the upper Bernoulli-plate and the plate-like specimen are relatively rotated while a treatment liquid is ejected to at least an upper surface of the plate-like specimen to treat the plate-like specimen, and supplying the upper and lower Bernoulli-plates with a heating medium or a cooling medium to heat or cool the treatment liquid to a predetermined temperature.

Thus, since the plate-like specimen can be treated by using the treatment liquid heated or cooled at the predetermined temperature, it is possible to enhance a treatment efficiency.

Also, the method of the present invention preferably further includes preparing a plurality of kinds of treatment liquids, and upon ejecting the treatment liquids to at least an upper surface of the plate-like specimen, heating or cooling the treatment liquids to temperatures dependent on their service purposes by using the heating medium or cooling medium.

When several kinds of treatment liquids are used, temperatures at which such different treatment liquids are used have to differ from each other in dependence of their intended purposes. According to the present invention, it is possible to rapidly elevate temperatures of the treatment liquids dependent on their intended purposes as well as temperatures of the Bernoulli-plates and the plate-like specimen. Therefore, it is advantageously enabled to save the time for treatment and cost in comparison with a treatment (cleaning) apparatus dedicated for only one kind of treatment liquid having its intended service temperature.

PREFERRED EMBODIMENTS OF THE PRESENT INVENTION

Hereinafter, preferred embodiments of the present invention will be described in detail with reference to the accompanying drawings. In the following description, the present invention is applied, by way of example, to a wafer cleaning apparatus.

Figure 1:
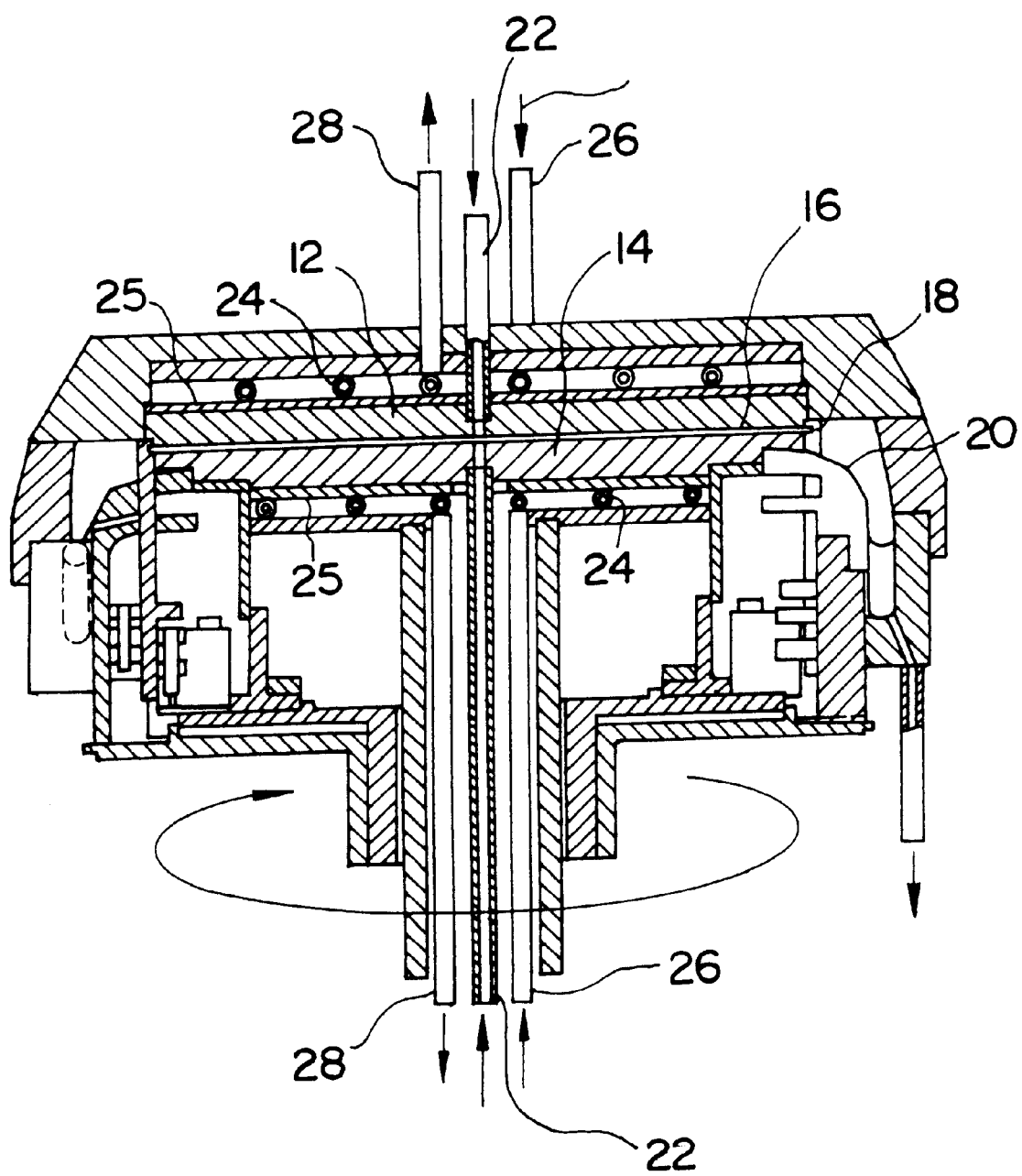
FIG. 1 is a schematic sectional view showing a specimen fluid-treating apparatus according to a first embodiment of the present invention.

FIG. 1 is a sectional view of a wafer cleaning apparatus 10 of a first embodiment according to the present invention. In this wafer cleaning apparatus, there are vertically disposed upper and lower Bernoulli-plates 12 and 14 in a parallel confronting relation to each other. During cleaning of a wafer 16, these parallel Bernoulli-plates 12 and 14 will be arranged to form therebetween a spacing or gap within a range from about 0.4 to 4 mm except the wafer thickness. Also, these Bernoulli-plates 12 and 14 are composed of SiC or graphite, or made of a graphite coated with glassy carbon or pyrocarbon or the like.

Between the upper and lower Bernoulli-plates 12 and 14, there is interposed a wafer (e.g., semiconductor wafer) 16 in a parallel confronting relation to inner surfaces of the upper and lower Bernoulli-plates 12 and 14. During cleaning of the wafer, this wafer 16 will be arranged to form a narrow clearance or gap within a range from about 0.2 to 2 mm relative to each of the upper and lower Bernoulli-plates 12, 14, preferably substantial the same clearance or gap relative to the upper Bernoulli-plate 12 as that relative to the lower Bernoulli-plate 14. That is, the respective clearances between the wafer 16 and the upper and lower Bernoulli-plates 12, 14 are set to be equal to each other. The wafer 16 is held and driven to rotate by a wafer chuck pin 18. On outer periphery farther from the wafer chuck pin 18, there is provided an outer jig 20 connected at its upper end to the lower Bernoulli-plate 14.

Figure 3:
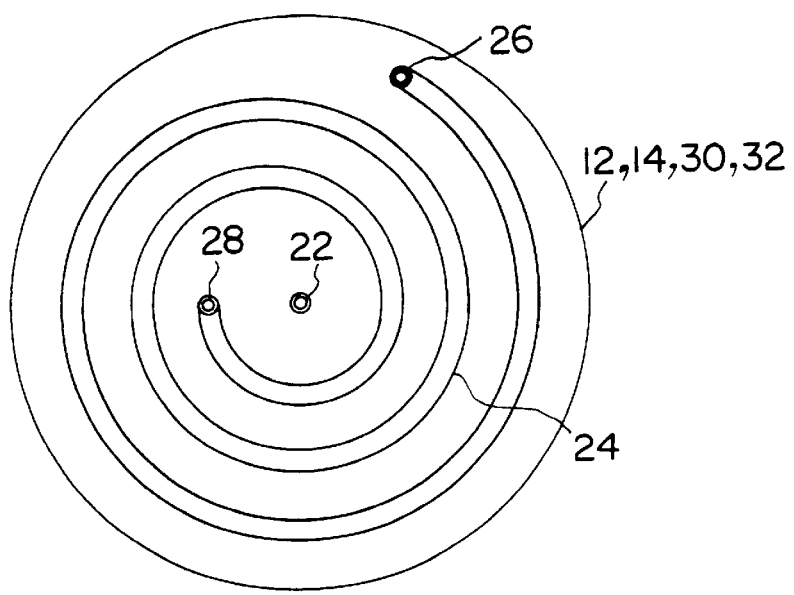
FIG. 3 is a plan view showing a shape of a circulating pipe or groove.

A cleaning-liquid supply valve 22 are provided on respective centers of the upper and lower Bernoulli-plates 12 and 14 so as to axially penetrate through the respective central portions of the upper and lower Bernoulli-plates 12 and 14 and adapted for supplying the wafer 16 with a cleaning liquid. The upper and lower Bernoulli-plates 12 and 14 include metal plates 25 disposed on overall outer surfaces thereof Also, onto each of the metal plates 25, there is assembled circulating pipe 24 which is in the form of a spiral as shown in FIG. 3 and adapted for circulating therethrough a heating medium or a cooling medium such as water and air. To an outer peripheral end of the circulating pipe 24, there is connected a supply pipe 26 for supplying the heating and cooling media into the circulating pipe 24. To an inner peripheral end of the circulating pipe 24, there is connected an discharge pipe 28 for discharging the heating and cooling media out of the circulating pipe 24.

FIG. 1 is a section view of the wafer cleaning apparatus which is taken along the line passing through centers of the cleaning liquid supply valve 22 and the discharge pipe 28 as shown in FIG. 3, upon looking toward the supply pipe 26. Hence, a connecting portion between the supply pipe 26 and the circulating pipe 24 is not shown in FIG. 1 because it is located farther backwards beyond this sectional view of FIG. 1. However, this connecting portion is formed in a manner similar to that of the discharge pipe 28 and the circulating pipe 24 as shown in FIG. 1. Thus, the heat of the heating and cooling media flowing through the circulating pipe 24 is configured to be transmitted via the metal plates 25 to the overall outer surfaces of the upper and lower Bernoulli-plates 12 and 14.

Now, the operation of this cleaning apparatus 10 will be explained.

When the upper Bernoulli-plate 12 is lifted up, the wafer 16 is carried and held on the wafer chuck pin 18. The upper Bernoulli-plate 12 is then lowered by means of a lifting mechanism (not shown) to a position, as a result of which a clearance or gap between the upper Bernoulli-plate 12 and the wafer 16 is of about 0.2–2 mm and clearances between the wafer 16 and the upper and lower Bernoulli-plates 12, 14 are substantially equal to each other.

Figure 4:
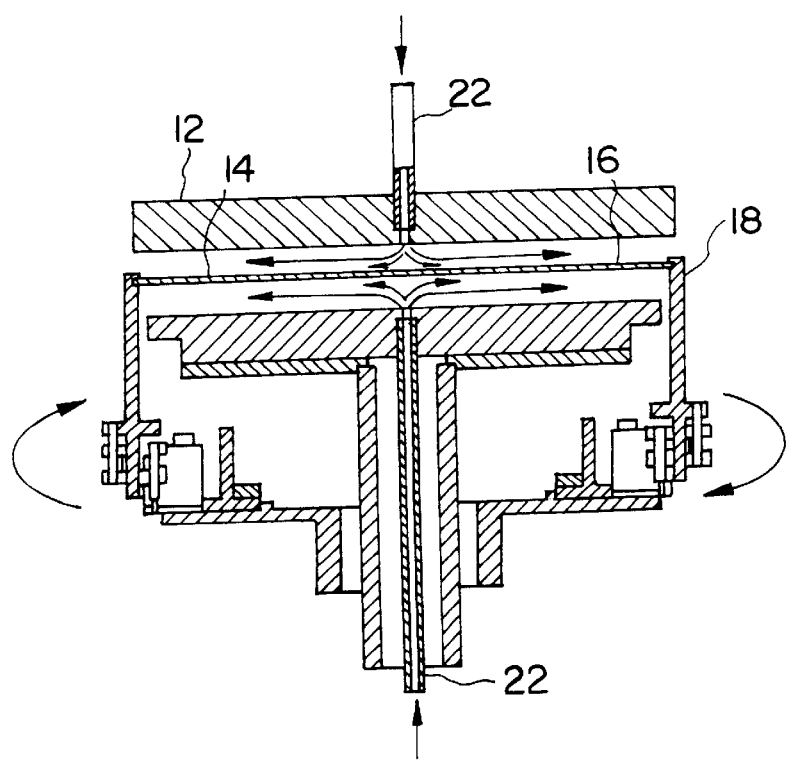
FIG. 4 is a schematic sectional view of the fluid-treating apparatus with a wafer being supplied with a cleaning medium.
Figure 5:
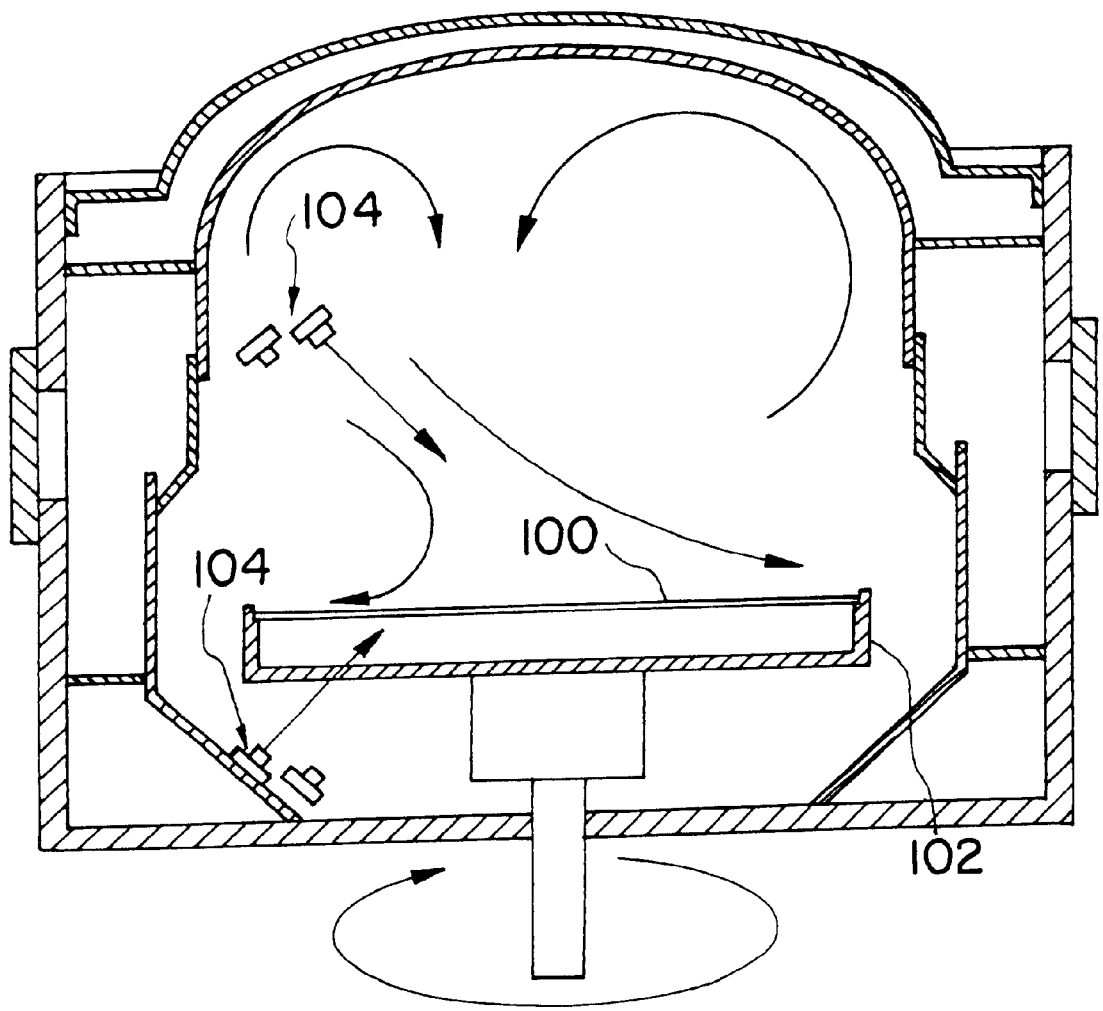
FIG. 5 is a schematic sectional view showing a conventional cleaning apparatus.

Then, at both sides of the upper and lower Bernoulli-plate 12 and 14, the heating media are supplied into the respective supply pipes 22 to flow through the corresponding circulating pipes 24 and be discharged from the corresponding discharge pipes 28 in a circulating manner until the upper and lower Bernoulli-plates 12 and 14 are heated to a predetermined temperature. Thus, these upper and lower Bernoulli-plates 12 and 14 will be rapidly heated in this embodiment. If the temperatures of these Bernoulli-plates have reached the predetermined point, the wafer chuck pin 18 is driven to rotate the wafer 16 and the cleaning liquids are supplied from the cleaning liquid supply valves 22 onto the rotating wafer 16 for cleaning the wafer 16 as shown in FIG. 4. In this case, the cleaning liquids will be heated or cooled in dependence of their operating temperature by the upper and lower Bernoulli-plates which have previously be heated or cooled as above.

At each side of the wafer 16, the cleaning liquid is supplied to the center and its neighborhood of the surface of the wafer 16 and then flows toward its outer periphery by means of the centrifugal force due to the rotation of the wafer 16, thereafter traveling along the outer jig 20 for discharge outwards. During cleaning of the water 16, since respective clearances formed between the wafer 16 and the upper Bernoulli-plates 12 and between the wafer 16 and the lower Bernoulli-plate 14 are respectively defined as narrow gaps, it is possible to interpose only the cleaning liquid in these clearances and eventually allow these clearances to be in a vacuum state during the rotation of the wafer 16. Accordingly, it is possible to accurately and rapidly elevate the temperature of the wafer 16 by a small amount of the cleaning liquid. Since the wafer 16 is not contact with the upper and lower Bernoulli-plates 12 and 14 and the respective clearances relative to the upper and lower Bernoulli-plates 12 and 14 are equal to each other, the wafer 16 does not vary in temperature partially over the surface thereof, i.e., the temperature variation is not occurred on the overall wafer 16. Also, the cleaning liquid is at the same temperature on one side of the wafer 16 as that on the other side of the wafer 16 so that the wafer 16 may be uniformly elevated in temperature thereon throughout.

Figure 2:
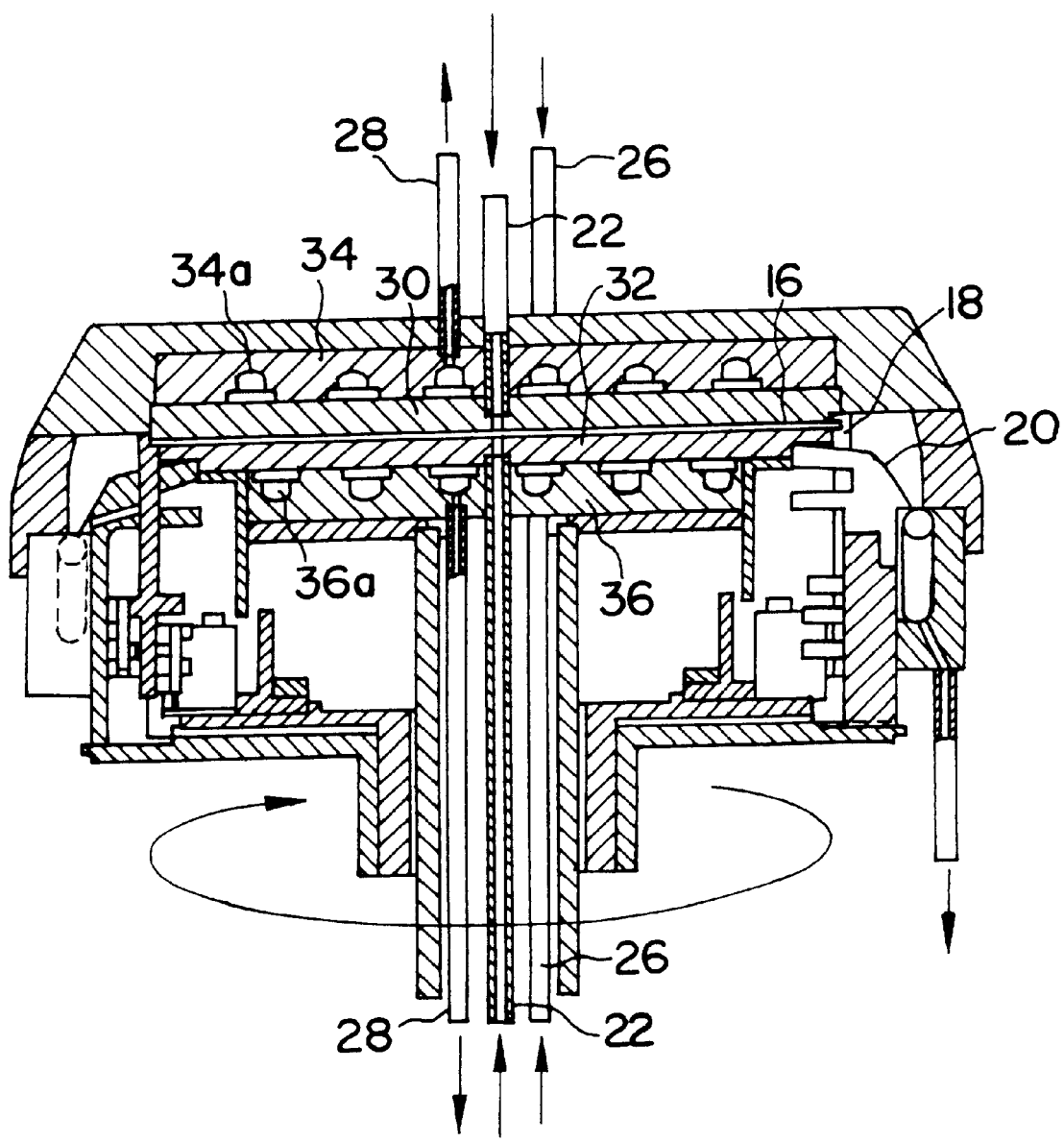
FIG. 2 is a schematic sectional view showing a fluid-treating apparatus according to a second embodiment of the present invention.

Referring to FIG. 2, there is shown a cleaning apparatus of a second embodiment according to the present invention. This cleaning apparatus includes upper and lower Bernoulli-plates 30 and 32 having plate-like members 34 and 36 attached to their corresponding Bernoulli-plates 30 and 32. In particular, these plate-like members 34 and 36 have respective grooves 34a and 36a formed therein, each of which is in the form of a spiral. In more detail, each of these grooves 34a and 36a creates a passage which is bounded partially by its corresponding Bernoulli-plates 30 and 32. Also, each of these spiral grooves 34a and 36a defines a sealed structure by using O-rings (not shown) provided between the plate-like member and its corresponding Bernoulli-plate. With such an arrangement, the upper and lower Bernoulli-plates 30 and 32 can be rapidly heated or cooled by circulating the heating medium or cooling medium through the grooves 34a and 36a. This cleaning apparatus of the second embodiment is similar in structure and operation other than those explained heretofore to that of the first embodiment.

Specifically, in the second embodiment as shown in FIG. 2, the grooves 34a and 36a are formed in the plate-like members 34 and 36. However, it is not intended to limit the invention to such a structure. That is, such grooves 34a and 36a are acceptable if they are formed between the upper Bernoulli-plate 30 and its corresponding plate-like members 34 and between the lower Bernoulli-plate 32 and its corresponding plate-like member 36, respectively. Thus, it is alternatively possible to form grooves in the upper and lower Bernoulli-plates 30 and 32, or to form grooves in both of the upper Bernoulli-plate 30 and the plate-like member 34 so as to span both of them and in both of the lower Bernoulli-like-plate 32 and the plate-like member 36 so as to span both of them, respectively.

It is to be understood that the grooves 34a and 36a formed between the upper Bernoulli-plate 34 and the plate-like member 34 and between the lower Bernoulli-plate 36 and the plate-like member 36 should not be limited to the spiral form as shown in FIG. 3. This is also applicable to those of the first embodiment.

Moreover, in order to rapidly heat or cool the upper and lower Bernoulli-plates, the circulating pipes 24 are employed in the first embodiment and the grooves 34a and 36aare employed in the second embodiment. However, these arrangements are intended to be merely illustrative of the invention. Numerous alternative arrangements may be devised so as to be adapted for rapidly heating or cooling of the upper and lower Bernoulli-plates.

As is apparent from the above description, since at least the upper Bernoulli-plate and the plate-like specimen are spaced from each other to define the narrow gap therebetwen, it is possible to interpose only a cleaning liquid between the plate-like specimen and the upper Bernoulli-plate. Then, upon cleaning the rotating wafer, this clearance between the plate-like specimen and the upper Bernoulli-plate are allowed to be in a vacuum state. Therefore, it is possible to accurately and rapidly elevate the temperature of the plate-like specimen by a small amount of the cleaning liquid.

Thus, it is enabled to shorten or save a time for the treatment (cleaning) task and reduce an amount of the treatment (cleaning) liquid, thereby improving a yielding, a throughput and a cost reduction.

When several kinds of treatment liquids are used, temperatures at which such different treatment liquids are used have to differ from each other in dependence of their intended purposes and service temperatures. According to the present invention, it is possible to rapidly elevate temperatures of the treatment liquids dependent on their intended purposes as well as temperatures of the Bernoulli-plates and the plate-like specimen. Therefore, also in this case, it is enabled to save a time for the treatment and cost in comparison with a conventional treatment (cleaning) apparatus dedicated for only one kind of treatment liquid having its service temperature.

Also, since opposite surfaces of the plate-like specimen are heated without contact with the upper and lower Bernoulli-plates, any temperature differences do not occur partially over the plate-like specimen, but instead the overall plate-like specimen is heated. Accordingly, any treatment variations such as cleaning variations on the plate-like specimen can be inhibited.

Yet further, since a gap between the plate-like specimen and the upper Bernoulli-plate and a gap between the plate-like specimen and the lower Bernoulli-plate are equal to each other, temperatures of the treatment liquids supplied to both sides of the plate-like specimen can be also equal to each other. As a result, both sides of the plate-like specimen can be raised to the same temperature. Therefore, any treatment variations on the specimen can be further inhibited.

Further, in a non-limiting embodiment of the invention, upper and lower Bernoulli-plates preferably are disposed in parallel with each other to define a narrow gap therebetween and supplied with a heating medium or a cooling medium to heat or cool a treatment liquid to a predetermined temperature. Thus, it is possible to enhance a treatment effect on the platelike like specimen disposed between the Bernoulli-plates.

Thus, since the plate-like specimen can be treated by using the treatment liquid heated or cooled at the predetermined temperature, it is possible to enhance a treatment efficiency.

Furthermore, according to the invention, preferably a plurality of kinds of treatment liquids are prepared and heated or cooled to temperatures dependent on their service purposes by using the heating medium or cooling medium. When several kinds of treatment liquids are used, temperatures at which such different treatment liquids are used must differ from each other depending upon their intended purposes and service temperatures. According to the present invention, it is possible to rapidly elevate temperatures of the treatment liquids depending upon their intended purposes as well as the temperatures of the Bernoulli-plates and the plate-like specimen. Therefore, also in this case, it is enabled to save time required for the treatment and cost in comparison with a conventional treatment (cleaning) apparatus dedicated for use with only one kind of treatment liquid having its service temperature.

What is claimed is:

1. A plate-like specimen fluid-treating apparatus comprising:

upper and lower Bernoulli-plates disposed in parallel with each other, wherein a plate-like specimen is disposed between said upper and lower Bernoulli-plates in a parallel confronting relation to inner surfaces of said upper and lower Bernoulli-plates such that said plate-like specimen is spaced a narrow gap of about 0.2 to 2 mm from at least said upper Bernoulli-plate, and wherein at least said upper Bernoulli-plate and said plate-like specimen are relatively rotated while a treatment liquid is ejected to at least an upper surface of said plate-like specimen to treat said plate-like specimen, and a passage provided on said upper and lower Bernoulli-plates and adapted for supplying said upper and lower Bernoulli-plates with a heating medium or a cooling medium to heat or cool said upper and lower Bernoulli-plates.

2. The plate-like specimen fluid-treating apparatus as claimed in claim 1, wherein said plate-like specimen is disposed between said upper and lower Bernoulli-plates in such a manner that one surface of said plate-like specimen is spaced said narrow gap from said upper Bernoulli-plate and that the other surface of said plate-like specimen is spaced said narrow gap from said lower Bernoulli-plate.

3. The plate-like specimen fluid-treating apparatus as claimed in claim 1, wherein said plate-like specimen is disposed between said upper and lower Bernoulli-plates plates in such a manner that one surface of said plate-like specimen is spaced from said upper Bernoulli-plate by a gap by which the other surface of said plate-like specimen is equivalently spaced from said lower Bernoulli-plate.

4. A plate-like specimen fluid-treating apparatus comprising:

a plate-like specimen chuck pin adapted for holding and rotating a plate-like specimen to be treated thereon;

upper and lower Bernoulli-plates disposed in parallel with each other, said plate-like specimen being interposed between said upper and lower Bernoulli-plates and in face to face relation to inner surfaces of said upper and lower Bernoulli-plates through a first gap between said plate-like specimen and said upper Bernoulli-plate and a second gap between said plate-like specimen and said lower Bernoulli-plate;

a treating-liquid supply valve for supplying a treating liquid into each of said upper and lower Bernoulli-plates so as to penetrate the treating liquid through them to eject the treating liquid to opposite surfaces of said plate-like specimen; and a heating-and-cooling media circulating member disposed on an outer surface of each of said upper and lower Bernoulli-plates and adapted for internally circulating a heating medium or a cooling medium to heat or cool its adjacent Bernoulli-plate.

5. The plate-like specimen fluid-treating apparatus as claimed in claim 4, wherein said heating-and-cooling media circulating member includes a metal plate attached to said outer surface of each of said upper and lower Bernoulli-plates and a spiral pipe assembled to said metal plate.

6. The plate-like specimen fluid-treating apparatus as claimed in claim 4, wherein said heating-and-cooling media circulating member includes a plate-like member attached to said outer surface of each of said upper and lower Bernoulli-plates and a spiral passage formed in said plate-like member.

7. The plate-like specimen fluid-treating apparatus as claimed in claim 6, wherein said spiral passage is formed between said plate-like member and its adjacent Bernoulli-plate to span both them in a sectional view.

8. The plate-like specimen fluid-treating apparatus as claimed in claim 4, wherein said first gap is substantially equal to said second gap.

9. The plate-like specimen fluid-treating apparatus as claimed in claim 8, wherein each of said first and second gaps is within a range from 0.2 to 2 mm.

* * * * *